(12) United States Patent
Tasaki

(10) Patent No.: US 7,956,430 B2
(45) Date of Patent: *Jun. 7, 2011

(54) SEMICONDUCTOR DEVICE INCLUDING GROOVE WIDTH VARIATION PORTION FOR INSPECTION

(75) Inventor: Yoshihide Tasaki, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/556,856

(22) Filed: Sep. 10, 2009

(65) Prior Publication Data

US 2009/0321858 A1    Dec. 31, 2009

Related U.S. Application Data

(62) Division of application No. 11/503,945, filed on Aug. 15, 2006, now Pat. No. 7,608,900.

(30) Foreign Application Priority Data

Aug. 31, 2005 (JP) ................................. 2005-250569

(51) Int. Cl.
    *H01L 29/84* (2006.01)
(52) U.S. Cl. ........ 257/417; 257/418; 257/419; 257/619; 257/E29.324; 73/514.34

(58) Field of Classification Search .......... 257/417–420; 73/514.34
See application file for complete search history.

(56) References Cited

U.S. PATENT DOCUMENTS

| | | | |
|---|---|---|---|
| 5,471,086 A | 11/1995 | Ipposhi et al. | |
| 5,567,880 A * | 10/1996 | Yokota et al. | 73/514.33 |
| 6,369,931 B1 * | 4/2002 | Funk et al. | 359/223.1 |
| 6,774,445 B2 | 8/2004 | Mutoh et al. | |
| 7,078,778 B2 | 7/2006 | Schenk | |
| 7,608,900 B2 * | 10/2009 | Tasaki | 257/417 |
| 2005/0274191 A1 | 12/2005 | Hasegawa et al. | |
| 2007/0215966 A1 | 9/2007 | Ikegami | |
| 2007/0261490 A1 | 11/2007 | Kai | |

* cited by examiner

Primary Examiner — A. Sefer
(74) Attorney, Agent, or Firm — Volentine & Whitt, P.L.L.C.

(57) ABSTRACT

An accelerator sensor includes a semiconductor substrate having a main front surface and a main rear surface, a first groove portion being formed along a front surface pattern, in the main front surface, a second groove portion being formed along a rear surface pattern, in the main rear surface, a through-hole being formed because of connection between at least parts of the first groove portion and the second groove portion and at least one groove width variation portion being formed in at least one of inner walls of the first groove portion. An offset of the rear surface pattern to the front surface pattern can be inspected easily by existence of the groove width variation portion.

14 Claims, 7 Drawing Sheets

FRONT SURFACE PATTERN

FRONT SURFACE PATTERN

BACK SURFACE PATTERN

1C–1C CROSS SECTION

1D–1D CROSS SECTION

FRONT SURFACE PATTERN

BACK SURFACE PATTERN 2C-2C CROSS SECTION

ENLARGED ILLUSTRATION OF Y SECTION

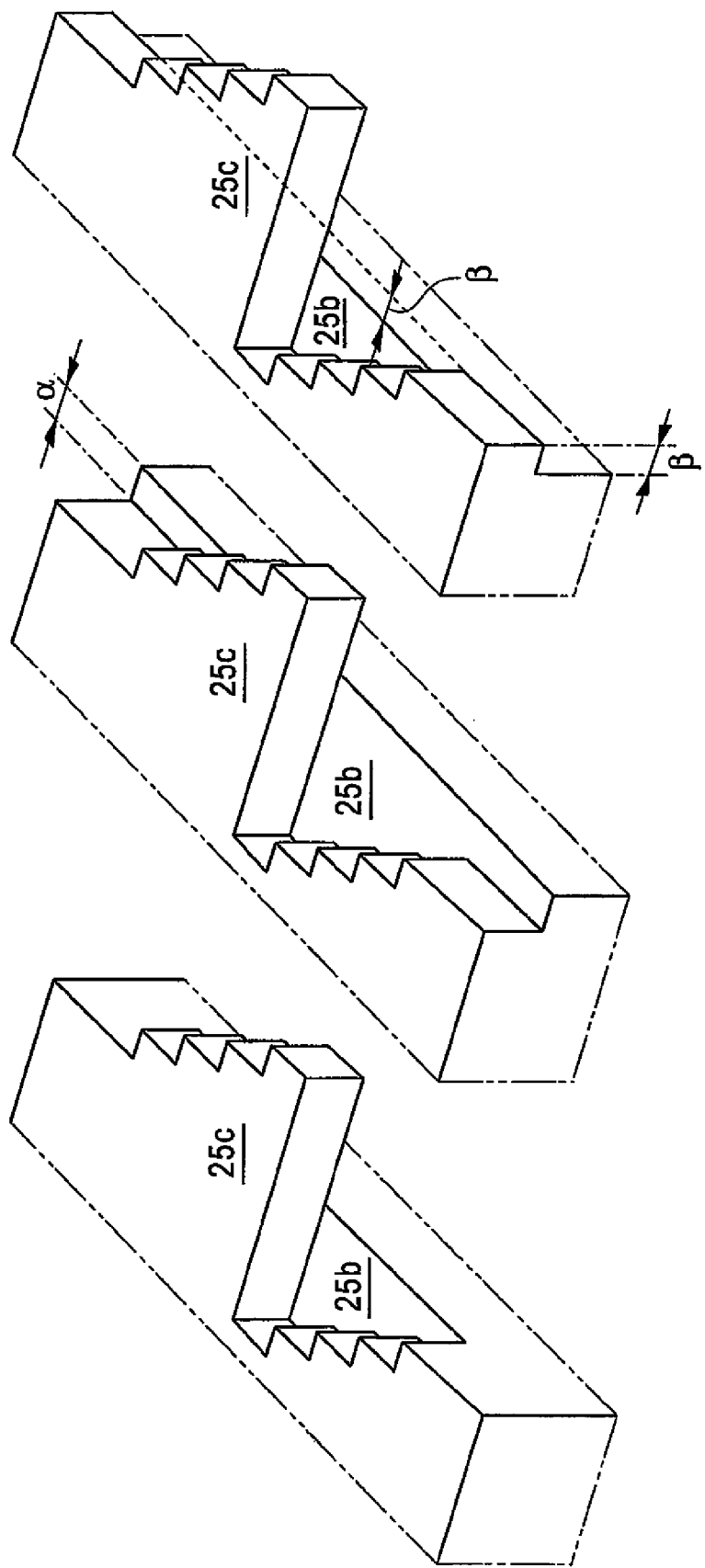

US 7,956,430 B2

SEMICONDUCTOR DEVICE INCLUDING GROOVE WIDTH VARIATION PORTION FOR INSPECTION

CROSS-REFERENCE TO RELATED APPLICATIONS

This application is a divisional application of application Ser. No. 11/503,945 filed on Aug. 15, 2006, now U.S. Pat. No. 7,608,900, which is hereby incorporated by reference in its entirety for all purposes.

BACKGROUND OF THE INVENTION

1. Field of the Invention

The present invention relates to a semiconductor device, such as a MEMS (Micro Electro Mechanical System) acceleration sensor, which is manufactured from a semiconductor substrate, and to a method of manufacturing and inspection thereof.

2. Description of the Related Art

FIGS. 1A through 1D show a conventional acceleration sensor. This acceleration sensor includes a substrate 10 having sensor circuits (not shown) mounted thereon and is integrally formed from a silicon wafer by using a semiconductor manufacturing technique. As shown in FIG. 1A and FIG. 1B, the substrate 10 includes four generally rectangular contoured grooves 11a through 11d each having a groove width. A spindle portion 12 is formed in the central region of the substrate. A quadrangular frame portion 13 is formed to surround a circumference of the spindle portion 12. Four brace portions 14 are bendable so as to act as a bendable cantilever. The substrate 10 has such a structure that four bendable brace portions 14 connect the spindle portion 12 to the frame portion 13 while spindle portion 12 is movable against the frame portion 13. A stress detecting sensor using a piezo electric element, etc. and a circuit such as wiring (not shown) are formed on a surface of each of the brace portions 14. In addition, the frame portion 13 has a length "A" of approximately 2 mm on a side and a height "B" of approximately 500 μm. Furthermore, a thickness of each of the brace portions 14 is approximately 10 μm.

This accelerator sensor is generally manufactured as follows. First, as is the case with conventional LSIs, a plurality of sensors, wiring and electrodes for external connection and others are formed on a front surface of the silicon wafer. Parts of the silicon wafer, which correspond to a region located between the spindle portion 12 and the frame portion 13, are then removed by etching so as to form the grooves 11a through 11d while leaving the brace portion 14. This etching is conducted on the front surface side. An etching depth is adjusted to be substantially equal to a thickness of the brace portion 14.

After the etching on the front surface side, the silicon wafer is flipped vertically. Parts of the silicon wafer, which correspond to a region located between the spindle portion 12 and the frame portion 13, are then removed by etching so as to form the grooves 11a through 11d in the rear surface side. This etching is conducted until the brace portions 14 remain, each having a given thickness and other parts of the silicon are removed to the depth of the parts etched in a surface side etching.

As a result, parts located between the spindle portion 12 and the frame portion 13 are removed to form the grooves 11a through 11d. Four brace portions 14 connect the spindle portion 12 to the frame portion 13. An accelerator sensor shown in FIGS. 1A through 1D is thereby obtained.

The accelerator sensor shown in FIGS. 1A through 1D is to be accommodated within a package. Electric wiring is provided for connecting the sensor circuits to an external connecting terminal outside of the package. As the four brace portions 14 connect the spindle portion 12 to the frame portion 13, in this accelerator sensor, the spindle portion 12 is displaced with respect to the frame portion 13 because of the bending of the brace portions 14 when acceleration is applied to the accelerator sensor. Bending magnitudes of the four brace portions 14 depend on the magnitude and direction of the applied acceleration. As bending sensors, such as the piezo electric elements are respectively provided on the brace portions 14, the magnitude and direction of the applied acceleration can be calculated on the basis of magnitudes of the bending of brace portions 14.

However, the above-mentioned accelerator sensor encounters the following problem. To leave the brace portions 14 which connect the spindle portion 12 to the frame portion 13, and separate the spindle portion 12 from the frame portion 13 by removing parts of a silicon wafer other than the brace portions 14, there is a necessity to conduct etching on both of the front surface side and the rear surface side. Therefore, after completion of etching, there is a necessity to inspect whether an offset between etching patterns in the front surface side and the rear surface side is within an acceptable tolerance in magnitude or not. It is to be noted that a large amount of displacement causes some defects, such as degradation of a sensor characteristic.

For an accurate measurement of the displacement or offset that exists between the grooves 11a through 11d forming a front surface pattern and the grooves 11a through 11d forming a rear surface pattern, one can typically use an apparatus which enables simultaneous inspection of a processed front surface and a processed rear surface of a substrate. In addition, one can use a method of inspecting the substrate by using an infrared microscope which shows through the substrate, in one surface. However, a particular apparatus is needed in each case. For this reason, an accurate inspection of the displacement can not be expected through an appearance check by using a typical metallographic microscope. There was therefore a possibility that defective products flew out.

An object of the present invention is to provide a semiconductor device which can be readily inspected for a displacement existing between grooves formed along a front surface pattern and grooves formed along a rear surface pattern, without using any special apparatus.

SUMMARY OF THE INVENTION

A semiconductor device of the present invention comprises a semiconductor substrate having a main front surface and a main rear surface, a first groove portion being formed along a front surface pattern, in the main front surface, a second groove portion being formed along a rear surface pattern, in the main rear surface, a through-hole being formed by a connection between at least parts of said first groove portion and said second groove portion and at least one groove width variation portion being formed in at least one of inner walls of said first groove portion. The groove width variation portion includes at least one of a concave portion and a convex portion.

The semiconductor device can make it easy to inspect a displacement in position of a rear surface pattern to a front surface pattern of the semiconductor substrate. In other words, one can easily inspect the displacement which changes as a function of an internal surface position in the second groove portion relative to the groove width variation portion.

BRIEF DESCRIPTION OF THE DRAWINGS

FIGS. 5A through 5C are a perspective views of modified shapes of the groove width variation portion.

DETAILED DESCRIPTION OF THE INVENTION

According to the present invention, there is provided a semiconductor device including a substrate block having a central spindle part movably supported by four bendable cantilevers extending from an encircled frame portion. The central spindle part and the frame portion are formed by four grooves formed on the major surface of the substrate through e.g. an etching process.

The grooves respectively have a groove width variation portion which is depressed or concave as stepwise slits having a given width. In addition, a stepwise convex portion of a groove width variation portion can be provided with a given width. In the convex portion, an overhang may be provided around a through-hole, with a shape of an appentice, from the edge of the front surface pattern. Furthermore, the concave portion and the convex portion may be combined together.

The above-mentioned object, other objects and novel characteristics of this invention will be more apparent when the following embodiments are read referring to appended drawings. However, drawings are only for the description and not for limitation of the scope of this invention.

A First Embodiment

Figure 1A:
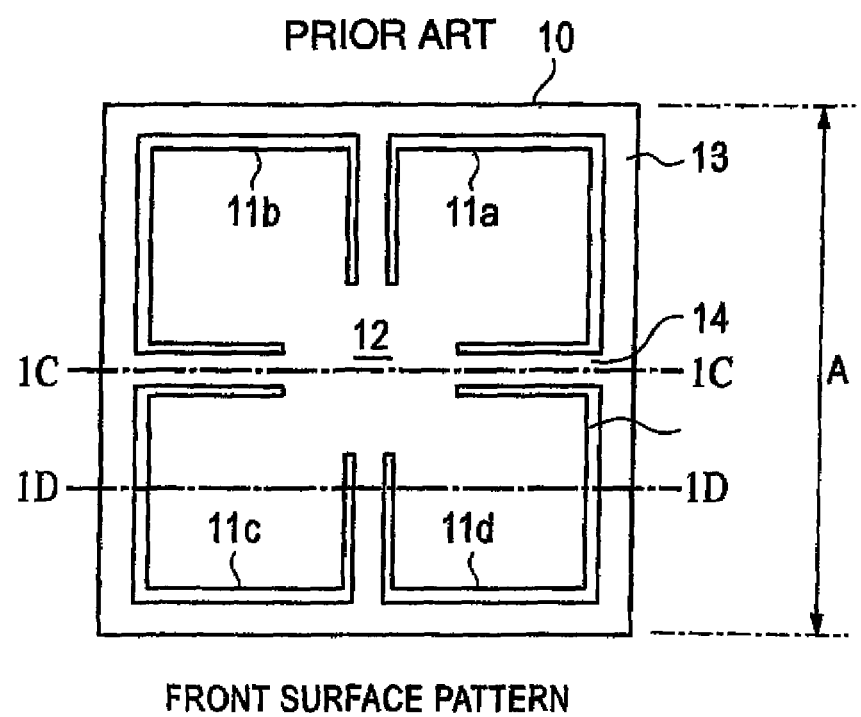
FIG. 1A is a plan view of a front surface of a conventional accelerator sensor.
Figure 1B:
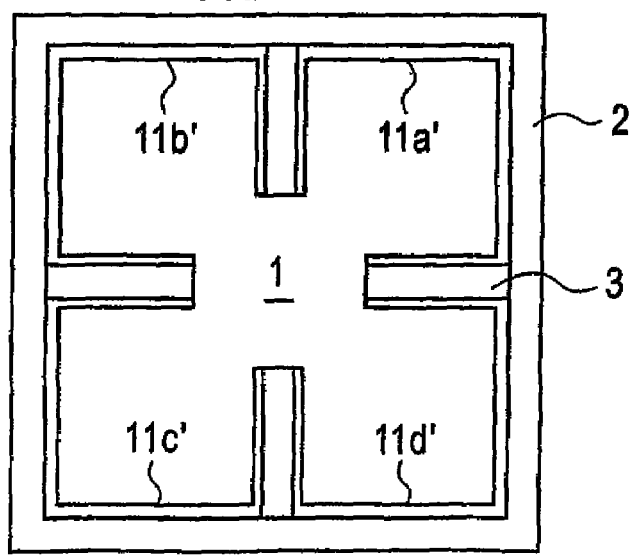
FIG. 1B is a plan view of a rear surface of the conventional accelerator sensor of FIG. 1A.
Figure 1C:
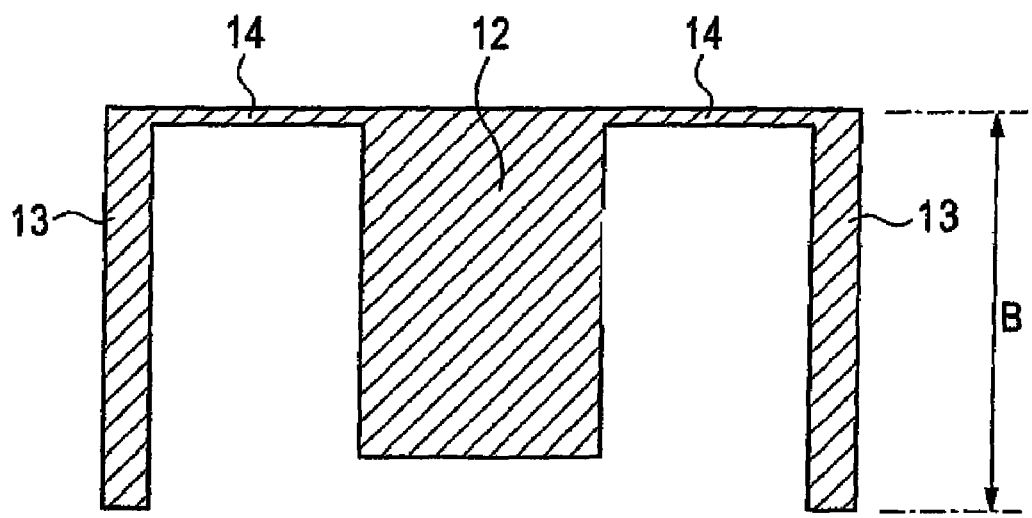
FIG. 1C is a cross-section of the accelerator sensor of FIG. 1A along a line 1C-1C.
Figure 1D:
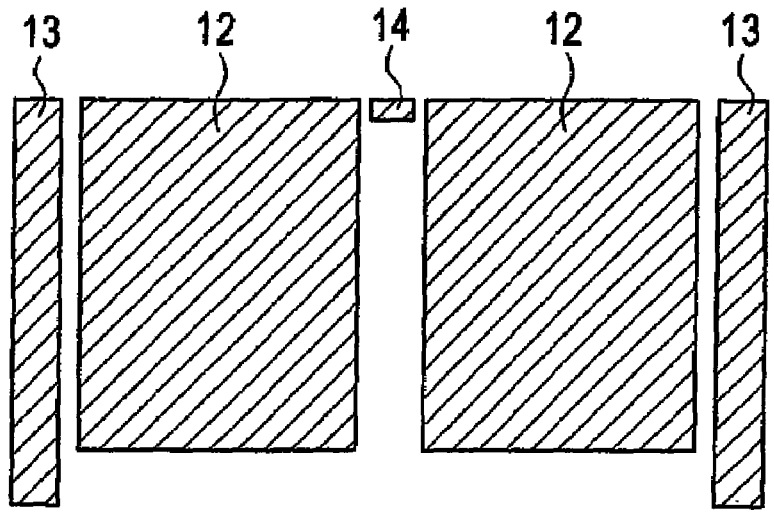
FIG. 1D is a cross-section of the accelerator sensor of FIG. 1A along a line 1D-1D.
Figure 2A:
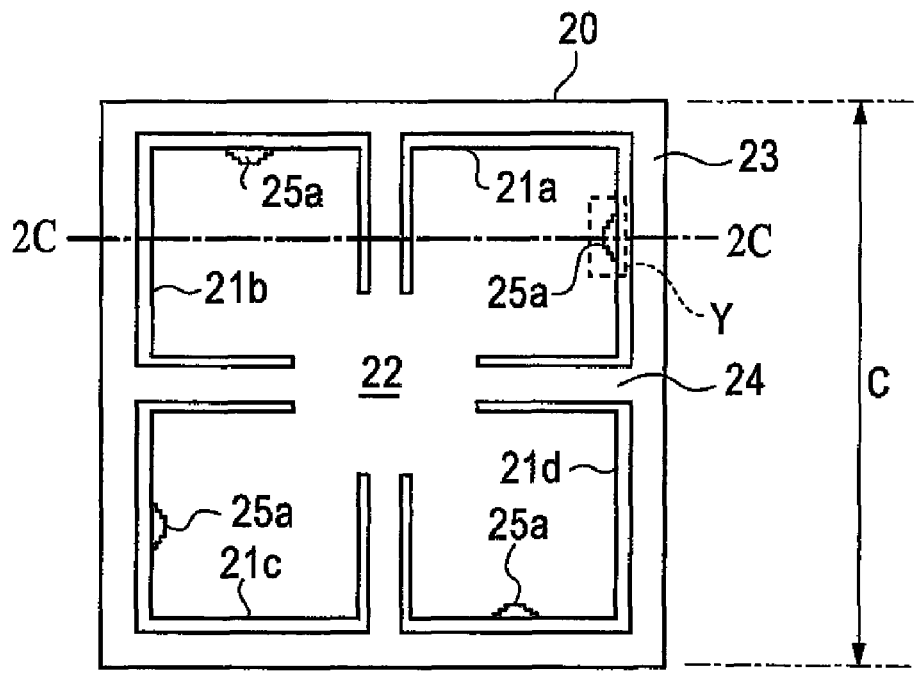
FIG. 2A is a plan view of a front surface of an accelerator sensor of a first embodiment of the present invention.
Figure 2B:
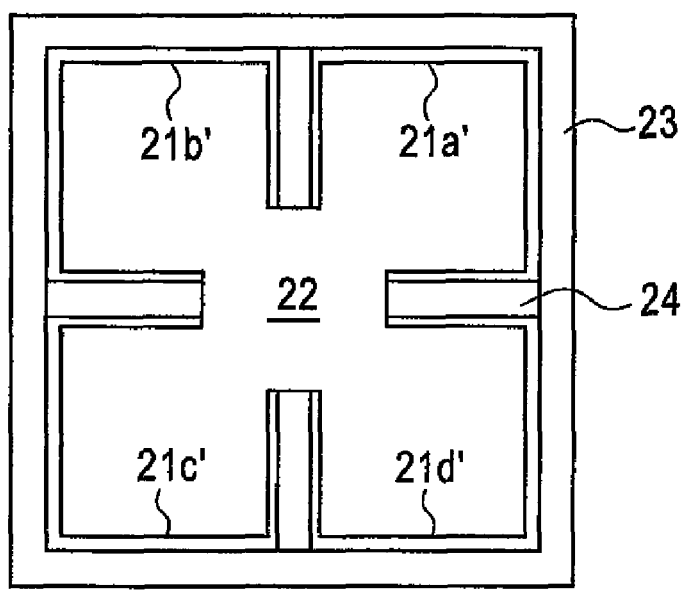
FIG. 2B is a plan view of a rear surface of an accelerator sensor of FIG. 2A.
Figure 2C:
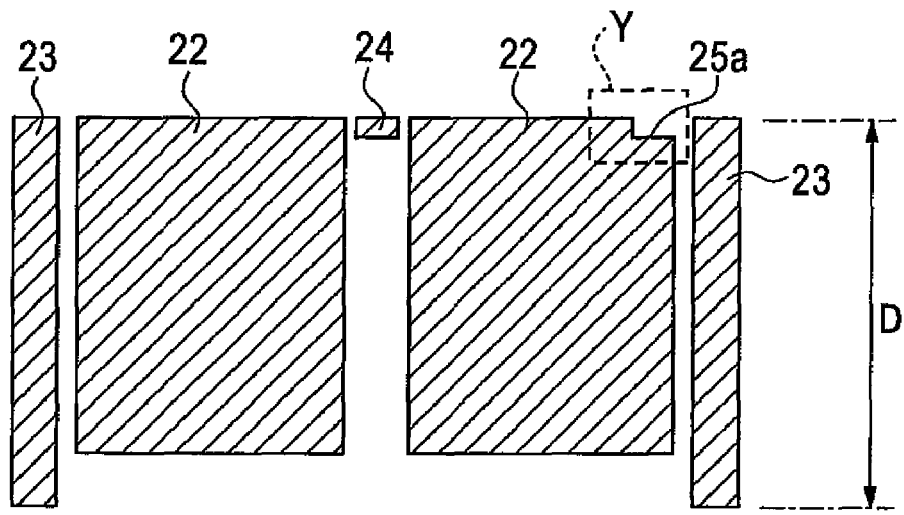
FIG. 2C is a cross-section of the accelerator sensor of FIG. 1A along a line 2C-2C.
Figure 2D:
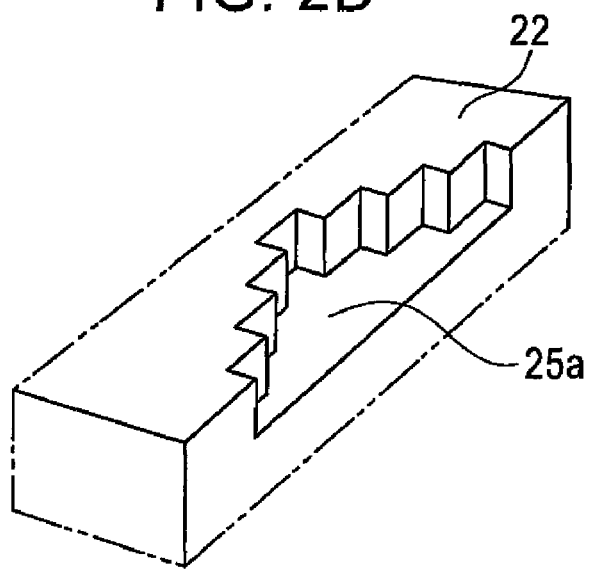
FIG. 2D is an enlarged perspective view of a part encircled by a letter Y In the accelerator sensor in FIG. 2A and FIG. 2C.

FIGS. 2A through 2D show an accelerator sensor of a the first embodiment of the present invention which includes a semiconductor substrate. As seen from FIG. 2A, the substrate has four front surface grooves 21a-21d forming a front surface pattern. As seen from FIG. 2B, the substrate has four rear surface grooves 21a'-21d' forming a rear surface pattern. FIG. 2C shows a cross-section along a line 2C-2C in FIG. 2A. FIG. 2D shows an enlarged perspective view of a part encircled by a letter Y in FIG. 2A and FIG. 2C. The sensor of FIG. 2A through FIG. 2D has similar structure to that of sensor of FIG. 1A through FIG. 1D and common reference numbers are applied to the counterparts.

This accelerator sensor of the present invention includes a substrate 20 having sensor circuits (not shown) mounted thereon and is integrally formed on the major surface thereof by applying a semiconductor manufacturing technique to a silicon wafer, in which groove portions 21a-21d and 21a'-21d' are formed on a front surface and a rear surface of the silicon wafer. In other words, the substrate includes the first groove portion formed along the front surface pattern, on the front surface of the silicon wafer substrate and the second groove portion formed along the rear surface pattern, on the rear surface of the silicon wafer substrate. Through-holes are formed by connection between at least parts of the first groove portion and the second groove portion together.

As shown in FIG. 2A and FIG. 2B, the semiconductor device of the present invention includes four grooves 21a through 21d each having a groove width. A spindle portion 22 is formed on a central region of the substrate. A quadrangular frame portion 23 is formed to surround a circumference of the spindle portion 22 at given intervals. Four brace portions 24 are bendable, thereby each acting as a bendable cantilever. The substrate 20 has such a structure that four bendable brace portions 24 connect the central region of the spindle portion 22 to the frame portion 23. The brace portions 24 are flexible. A stress detecting sensor using a piezo electric element etc. and a circuit, such as wiring (not shown), are formed on a surface of the brace portions 24. The frame portion 23 has a length "C" of approximately 2 mm on a side and a height "D" of approximately 500 µm. Furthermore, a thickness of each of the brace portions 24 is approximately 10 µm.

In addition, slits (concave portion) 25a or groove width variation portions for inspection are formed in peripheral part of a surface of the spindle portion 22. The slits 25a are formed at four symmetrical parts. As shown in FIG. 2D, the slits 25a are formed by etching a part of the surface of the spindle portion 22. An etching depth is equal to a thickness (for example, approximately 10 µm) of the brace portions 24. The slits 25a have a symmetrical stepwise shape. One step of the stepwise shape has a height of 5 µm and a width of 5 µm. The total number of steps is approximately 3 to 4. Therefore, in FIG. 2D, a slit length of the longest part in an outer edge portion is about 35 µm, and a slit length in an inner side of one step is about 25 µm, and a slit length in the inner side of two step is about 15 µm, and a slit length of the innermost part is about 5 µm.

Figure 3:
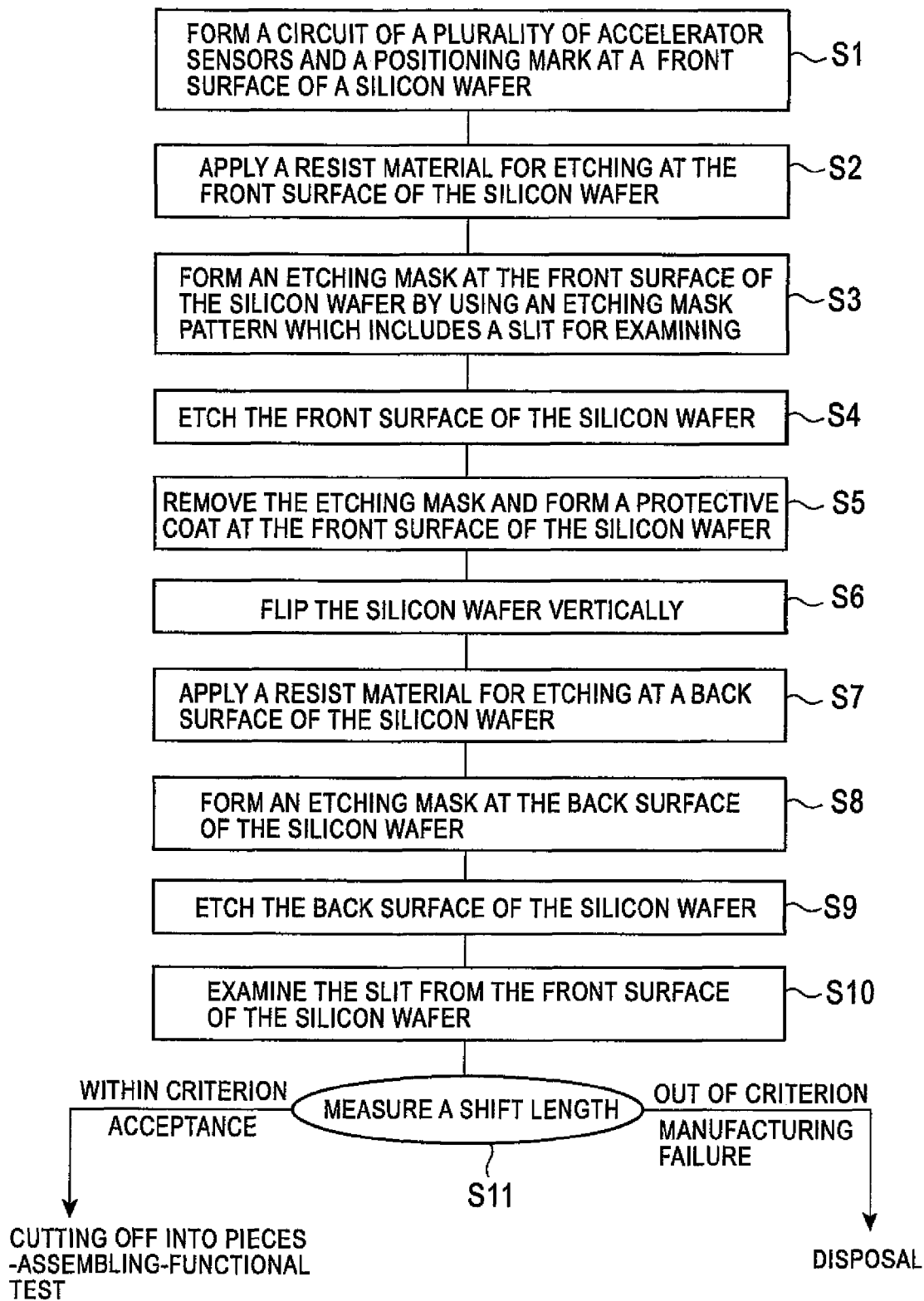
FIG. 3 is a flowchart representing a method of manufacturing the accelerator sensor shown in FIG. 1.

FIG. 3 is a flowchart representing a method of manufacturing the accelerator sensor in FIG. 2. Referring to FIG. 3, the method of manufacturing the accelerator sensor in FIGS. 2A-2D will be described below.

In step S1, a silicon wafer is prepared having a thickness of approximately 500 µm. A sensor, a wiring, an electrode for external connection and other elements are formed on a main front surface of the silicon wafer, in a similar process as a typical LSI. On this occasion, sensor circuits corresponding to a plurality of the accelerator sensors are formed, on an interior part of the silicon wafer except for an outer circumference portion of the silicon wafer. In addition, a positioning mark is formed on the outer circumference portion of the silicon wafer.

In step S2, a resist material is then applied to a surface of the silicon wafer on which the sensor circuits are formed.

In step S3, a photolithography process is conducted for the resist material on the front surface of the silicon wafer, using an etching mask pattern which includes the slits 25a of an inspection pattern. An etching mask is thereby formed on the surface of the silicon wafer. This etching mask covers an outer circumference portion of the silicon wafer, all of the frame portion 23 and the brace portions 24 of the accelerator sensor and a front surface of the spindle portion 22 except the slits 25a.

In step S4, the front surface of the silicon wafer is etched by using the etching mask formed in step S3. An etching depth is equal to the thickness of the brace portions 24 (approximately 10 μm). A portion etched in step S4 defines the first groove portion.

In step S5, the etching mask on the front surface of the silicon wafer is removed. A protective coat is then formed over the entire front surface of the silicon wafer.

In step S6, the silicon wafer is flipped vertically to process a rear surface of the silicon wafer.

In step S7, a resist material for etching is applied to the rear surface of the silicon wafer. In step S8, a photolithography process is conducted for the resist material on the rear surface of the silicon wafer, using an etching mask pattern for the rear surface of the silicon wafer. The etching mask is thereby formed thereon. Alignment of this etching mask pattern is conducted on the basis of the positioning mark formed on the front surface of the silicon wafer in step S1, using an aligner for both sides. This etching mask covers an outer circumference portion of the rear surface of the silicon wafer, a surface of the frame portion 23 and the spindle portion 22 of the accelerator sensor. The etching mask is not formed on a part which corresponds to a backside of the brace portions 24.

In step S9, the rear surface of the silicon wafer is etched by using the etching mask formed in step S8. A portion etched in step S9 defines the second groove portion. Etching is conducted until the etching depth reaches the backside of the brace portions 24. In other words, the etching depth is a dimension in which a thickness of the brace portions 24 (about 10 μm) is subtracted from the thickness of the silicon wafer (about 500 μm). Silicon located between the spindle portion 22 and the frame portion 23 is thereby removed to form the through-hole. The through-hole is formed in a portion where the first groove portion and the second groove portion couple or connect to each other. Four brace portions 3 are formed in a portion where the first groove portion and the second groove portion do not connect. These four brace portions 3 connect the spindle portion 22 to the frame portion 23. The accelerator sensor shown in FIG. 2A-2D is thereby provided.

In step S10, the slits 25a (or the groove width variation portion) provided in the spindle portion 22 of the accelerator sensor are inspected by using a metallographic microscope, from the front surface side of the silicon wafer on which the accelerator sensor is formed. In cases where a rear surface pattern completely coincides with a front surface pattern, an inner wall of the first groove portion (which is formed by a front surface etching) coincides with a side surface of the spindle portion 22 (which is formed by a rear surface etching) or an inner wall of the second groove portion. An ideal shape shown in FIG. 2C is thereby obtained. In cases where the rear surface pattern does not coincide with the front surface pattern, such displacement results in shapes shown in FIG. 4A and FIG. 4B instead of FIG. 2C.

Figure 4A:
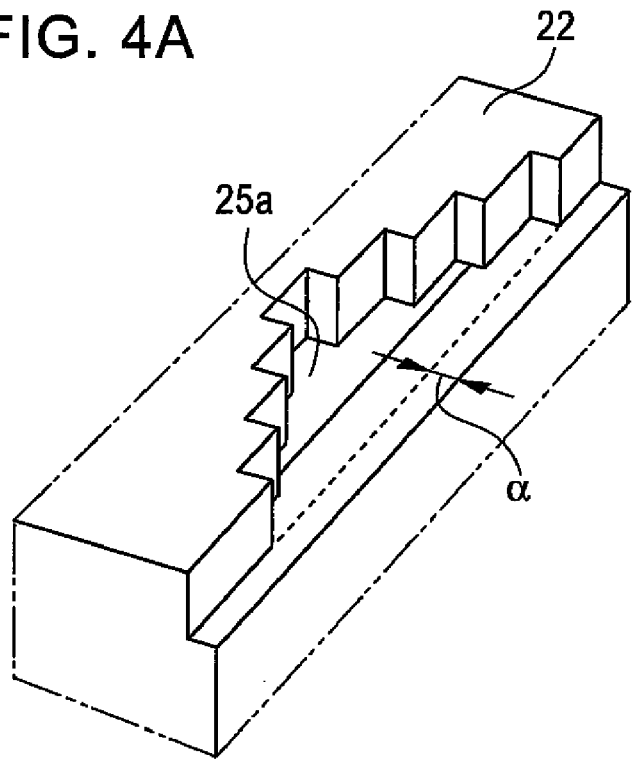
FIG. 4A is an enlarged perspective view of the part Y shown in FIGS. 2A and 2C, representing a state in which a pattern in FIG. 2A and a pattern in FIG. 2B are misaligned each other to cause an offset $\alpha$.
Figure 4B:
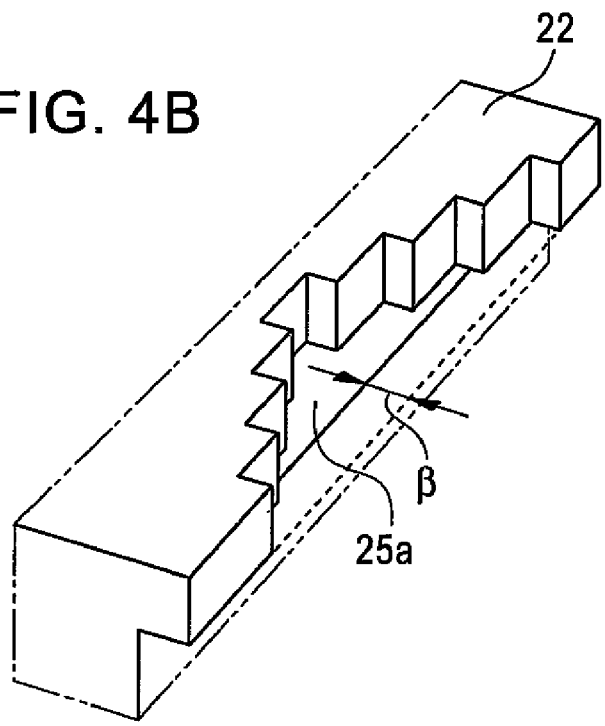
FIG. 4B is an enlarged perspective view of the part Y in FIG. 2A, representing a state in which a pattern in FIG. 2A and a pattern in FIG. 2B are misaligned each other to cause an offset $\beta$.

FIG. 4A and FIG. 4B are enlarged perspective views of the Y section in FIG. 2A, which represent slit condition in which the pattern in FIG. 2B does not coincide with the pattern in FIG. 2A. For example, in cases where the rear surface pattern is misaligned to the right, a condition shown in FIG. 4A may be obtained. In this instance, the side surface of the spindle portion 22, which is formed by the rear surface etching, sticks out (shifts) to the side surface of the spindle portion 22, which is formed by the front surface etching. One can know a shift length by measuring a length α. In cases where the rear surface pattern is misaligned to the left, a condition shown in FIG. 4B may be obtained. In this instance, the side surface of the spindle portion 22, which is formed by the front surface etching, sticks out (shifts) to the side surface of the spindle portion 22, which is formed by the rear surface etching. Therefore, one can not measure a shift length from the front surface side, at a portion other than the slits. However, one can inspect a shift length β in the side surface of the spindle portion 22 through the slits 25a, as the slits 25a are formed on the front surface of the spindle portion 22.

In step S11, acceptability of dimensional accuracy is determined on the basis of the inspection result in the step S10. In cases where all of the accelerator sensors are rejected, a silicon wafer will be destroyed as a defective manufacture. In cases where some of the accelerator sensors are accepted, the accelerator sensors are divided to be built into a package. A function test process is then conducted. In addition, the shift length and a shift direction obtained in the step S10 are stored as compensation data for positioning, for the benefit of future manufacturing processes.

As mentioned above, the accelerator sensor according to the present invention includes the spindle portion 22 on which the slits 25a or the groove width variation portions for inspection are formed. The accelerator sensor of the present invention can thereby make it easy to inspect a pattern displacement from the front surface side, by using a typical metallographic microscope, without using any special apparatus. In addition, the slits 25a have an equally spaced stepwise shape. Therefore, the accelerator sensor of the present invention can make it easy to inspect the shift length range by checking a position of the side surface of the spindle portion 22 to the slits 25a. Furthermore, the slits 25a are formed in each side of the surface of the spindle portion 22 (4 portions in all). Therefore, it is easy to detect the shift length in the accelerator sensor of the present invention, in lengthwise and crosswise direction.

In addition, in a semiconductor device according to the present invention, several variations are available without being limited to the first embodiment described above. For example, such variations are as follows. (1) An accelerator sensor is described by way of illustration. However, the present invention can be applied to all semiconductor devices which are processed to a shape having a through-hole formed by etching from both a front surface side and a rear surface side of a semiconductor wafer, such as silicon. (2) The slits 25a dimension is illustrative only. The dimension can be properly set as a function of a needed dimensional accuracy and an accuracy of an apparatus, such as a microscope, used for inspection. For example, in cases where a shift length of acceptance/rejection criteria is 5 μm, one step dimension of the slits 25a should be 5 μm. Therefore, when the shift length is within the one step dimension, it is accepted. When the shift length is over the one step dimension, it is rejected. (3) The semiconductor wafer is not limited to a silicon wafer. For example, the present invention can be applied to a multilayer substrate in which an insulating film such as oxide silicon is formed on a support substrate such as silicon, and a surface active layer such as silicon is provided on the insulating film. One example of the multilayer substrate is a SOI (Silicon On Insulator) substrate. (4) It is described that the etching process is conducted from both sides of the front surface and the rear surface of the silicon wafer. However, the present invention can be utilized for displacement confirmation in a composite substrate in which two processed substrates are adhered together. (5) Slits 25a for inspection are symmetrically positioned on the front surface of the spindle portion 22 (four places in total). This placement is for balance of flexible regions in the accelerator sensor. In cases where slits are provided at the frame portion 23, there is no need to consider the balance.

The Second Embodiment

FIGS. 5A-5C are perspective views of the groove width variation portion of an inspection pattern, representing the second embodiment of the present invention. The inspection pattern is provided as a substitute for the slits 25a in FIG. 2A through 2D, and comprise stepwise slits 25b and stepwise projections 25c. The stepwise slits 25b are formed by etching the surface of the spindle portion 12 in the accelerator sensor to a given depth (same thickness as the brace portion 24), in a similar fashion as the slits 25a in FIG. 2A-2D. On the contrary, in the stepwise projections 25c, a projection with the same thickness as the brace portion 24 overhangs with respect to a through-hole side from an outer edge of the spindle portion 12, like an appentice. The stepwise projections have a stepwise shape.

In a method of manufacturing the accelerator sensor with such inspection pattern, the etching mask pattern used in step S3, in the first embodiment, is changed to a mask pattern including the stepwise slits (stepwise concave portion) 25b and the stepwise projections (stepwise convex portion) 25c. Other methods are the same as the first embodiment.

The etching mask pattern for the surface of the silicon wafer includes patterns of the stepwise slits 25b and the stepwise projections 25c. The etching mask thereby exposes a place where the stepwise slits should be formed, and covers a place where the stepwise projections 25c should be formed. Therefore, the stepwise slits 25b and the stepwise projections 25c are formed at the same time, by etching the surface of the silicon wafer.

In cases where a rear surface pattern completely coincides with a front surface pattern, an inner wall of the first groove portion (which is formed by a front surface etching) coincides with a side surface of the spindle portion 22 (which is formed by a rear surface etching) or an inner wall of the second groove portion. An ideal shape shown in FIG. 5A is thereby obtained.

In cases where the rear surface pattern is misaligned to the right, a condition shown in FIG. 5B may be obtained. In this instance, the side surface of the spindle portion 22, which is formed by the rear surface etching, sticks out (shifts) to the side surface of the spindle portion 22, which is formed by the front surface etching. Therefore, this shift length overlaps the stepwise projections 25c. One can measure acceptance/rejection by checking a position of the side surface of the spindle portion 22 relative to the step of the stepwise projections.

In addition, in cases where the rear surface pattern is misaligned to the left, a condition shown in FIG. 5C may be obtained. In this instance, the side surface of the spindle portion 22, which is formed by the front surface etching, sticks out (shifts) to the side surface of the spindle portion 22, which is formed by the rear surface etching. The stepwise slits 25b are formed on the surface of the spindle portion 22. One can therefore measure acceptance/rejection by checking a position of the side surface of the spindle portion 22 relative to the step of the stepwise slits, through the stepwise slits 25b.

As described above, the inspection pattern in the second embodiment comprises the stepwise projections (stepwise convex portions) 25c in combination with the stepwise slits (stepwise depressed or concave portions) 25b. Therefore, the semiconductor device according to the present invention can make it easy to measure the shift length from the front surface side and enable the measurement to be conducted correctly.

This application is based on Japanese Patent Application No. 2005-250569 which hereby incorporated by reference.

What is claimed is:

1. An acceleration sensor device comprising:
   a substrate having a front surface and a rear surface, the substrate including a weight portion, a frame portion surrounding the weight portion, and a brace portion connecting the frame portion to the weight portion;
   at least one sensor element attached to or buried in the brace portion;
   a first groove portion having a front surface pattern in the front surface;
   a second groove portion having a rear surface pattern in the rear surface, at least parts of said first groove portion and said second groove portion overlapping so that the overlapping parts of the first and second groove portions become through-holes that extend entirely through the substrate; and
   at least one groove width variation portion including a concave portion extending into at least one inner wall of said first groove portion at the through-holes, wherein a part of said concave portion of said at least one groove width variation portion does not overlap the second groove portion, and said at least one groove width variation portion includes a stepwise shape in a plane parallel to said first front surface.

2. The acceleration sensor device as recited in claim 1, wherein said first groove portion includes a plurality of partial grooves and said at least one groove width variation portion includes a plurality of groove width variation portions, each at respective different ones of said partial grooves.

3. The acceleration sensor device as recited in claim 2, wherein each of said front surface and said rear surface has a rectangular shape, and said partial grooves are, respectively, four rectangular grooves, and said groove width variation portions are respectively positioned at positions respectively corresponding to four sides of said substrate.

4. The acceleration sensor device as recited in claim 1, wherein a spindle portion is located at a central region of said substrate, and four cantilever portions resiliently support the spindle portion to an edge of the substrate.

5. The acceleration sensor device as recited in claim 3, wherein a spindle portion is located at a central region of said substrate, and four cantilever portions resiliently support the spindle portion to an edge of the substrate.

6. The acceleration sensor device as recited in claim 1, wherein said substrate includes a first substrate portion and a second substrate portion that is joined with the first substrate portion, said first groove portion is formed in the first substrate portion, and said second groove portion is formed in the second substrate portion.

7. The acceleration sensor device as recited in claim 1, wherein said substrate is an SOI substrate.

8. An acceleration sensor device comprising:
   a substrate having a front surface and a rear surface, the substrate including a weight portion, a frame portion surrounding the weight portion, and a brace portion connecting the frame portion to the weight portion;
   at least one sensor element attached to or buried in the brace portion;
   a first groove portion having a front surface pattern in the front surface;

a second groove portion having a rear surface pattern in the rear surface, at least parts of said first groove portion and said second groove portion overlapping so that the overlapping parts of the first and second groove portions become through-holes that extend entirely through the substrate; and at least one groove width variation portion including a concave portion extending into at least one inner wall of said first groove portion at the through-holes, wherein a part of said concave portion of said at least one groove width variation portion does not overlap the second groove portion, and said first groove portion includes a plurality of partial grooves and said at least one groove width variation portion includes a plurality of groove width variation portions, each at respective different ones of said partial grooves.

9. The acceleration sensor device as recited in claim 8, wherein each of said front surface and said rear surface has a rectangular shape, and said partial grooves are, respectively, four rectangular grooves, and said groove width variation portions are respectively positioned at positions respectively corresponding to four sides of said substrate.

10. The acceleration sensor device as recited in claim 8, wherein said substrate includes a first substrate portion and a second substrate portion that is joined with the first substrate portion, said first groove portion is formed in the first substrate portion, and said second groove portion is formed in the second substrate portion.

11. The acceleration sensor device as recited in claim 8, wherein said substrate is an SOI substrate.

12. An acceleration sensor device comprising:
a substrate having a front surface and a rear surface, the substrate including a weight portion, a frame portion surrounding the weight portion, and a brace portion connecting the frame portion to the weight portion;
at least one sensor element attached to or buried in the brace portion;
a first groove portion having a front surface pattern in the front surface;
a second groove portion having a rear surface pattern in the rear surface, at least parts of said first groove portion and said second groove portion overlapping so that the overlapping parts of the first and second groove portions are through-holes that extend entirely through the substrate; and
at least one groove width variation portion including a concave portion extending into at least one inner wall of said first groove portion at the through-holes, wherein a part of said concave portion of said at least one groove width variation portion does not overlap the second groove portion, and said at least one groove width variation portion includes a convex portion that protrudes from the at least one inner wall into the through-holes.

13. The acceleration sensor device as recited in claim 12, wherein said substrate includes a first substrate portion and a second substrate portion that is joined with the first substrate portion, said first groove portion is formed in the first substrate portion, and said second groove portion is formed in the second substrate portion.

14. The acceleration sensor device as recited in claim 12, wherein said substrate is an SOI substrate.

* * * * *